(12) United States Patent
Whatmough et al.

(10) Patent No.: US 9,057,761 B2
(45) Date of Patent: Jun. 16, 2015

(54) SENSING SUPPLY VOLTAGE SWINGS WITHIN AN INTEGRATED CIRCUIT

(75) Inventors: Paul Nicholas Whatmough, Cambridge (GB); David Michael Bull, Cambridge (GB); Shidhartha Das, Norwich (GB)

(73) Assignee: ARM Limited, Cambridge (GB)

( * ) Notice: Subject to any disclaimer, the term of this patent is extended or adjusted under 35 U.S.C. 154(b) by 664 days.

(21) Appl. No.: 13/341,547

(22) Filed: Dec. 30, 2011

(65) Prior Publication Data

US 2013/0169350 A1    Jul. 4, 2013

(51) Int. Cl.
*G01R 31/30* (2006.01)

(52) U.S. Cl.
CPC ............ *G01R 31/3004* (2013.01); *G01R 31/30* (2013.01)

(58) Field of Classification Search
CPC ........ G01R 31/02; G01R 31/26; G01R 31/40; G01R 31/3004; G05F 3/02; G05F 3/24
See application file for complete search history.

(56) References Cited

U.S. PATENT DOCUMENTS

| 7,176,695 B2 * | 2/2007 | Bhushan et al. ............... 324/615 |
| 2008/0036477 A1 * | 2/2008 | Jenkins et al. ................. 324/713 |

OTHER PUBLICATIONS

R. Franch et al, "On-chip Timing Uncertainty Measurements on IBM Microprocessors" International Test Conference, IEEE, 2008, pp. 1-7.

A. Muhtaroglu et al, "On-Die Droop Detector for Analog Sensing of Power Supply Noise" IEEE Journal of Solid-State Circuits, vol. 39, No. 4, Apr. 2004, pp. 651-660.

P.J. Restle et al, "Timing Uncertainty Measurements on the Power5 Microprocessor" 2004 IEEE International Solid-State Circuits Conference, Session 19/Clock Generation and Distribution/19.7, 2004, 8 pages.

E. Alon et al, "Circuits and Techniques for High-Resolution Measurement of On-Chip Power Supply Noise" IEEE Journal of Solid-State Circuits, vol. 40, No. 4, Apr. 2005, pp. 820-828.

S. Pant et al, "A Charge-Injection-Based Active-Decoupling Technique for Inductive-Supply-Noise Suppression" 2008 IEEE International Solid-State Circuits Conference, Session 22/Variation Compensation & Measurement/22.9, pp. 416, 417, 624.

* cited by examiner

*Primary Examiner* — Minh N Tang
(74) *Attorney, Agent, or Firm* — Pramudji Law Group PLLC; Ari Pramudji

(57) ABSTRACT

An integrated circuit including a plurality of sensors configured to sense variations in supply voltage levels at points within the integrated circuit is disclosed. The plurality of sensors are distributed across the integrated circuit and have transistor devices such that process variations in the transistor devices within the sensors are such that a sensing result will have a random voltage offset that has a predetermined probability of lying within a pre-defined voltage offset range. The integrated circuit is configured to transmit results from multiple ones of the plurality of sensors to processing circuitry such that the variations in the supply voltage levels can be determined with a voltage offset range that is reduced compared to the pre-defined voltage offset range.

23 Claims, 9 Drawing Sheets

SENSING SUPPLY VOLTAGE SWINGS WITHIN AN INTEGRATED CIRCUIT

TECHNICAL FIELD

The technical field relates to the field of semiconductor processing devices and in particular to techniques for addressing variations in voltage supplied to integrated circuits.

BACKGROUND

Supplying power to integrated circuits such that there is a relatively constant voltage supplied across different devices that will have different impedances and different power requirements is not straightforward. Time varying circuit impedance and imperfect voltage regulation can both lead to supply voltage swings. Changes in the voltage difference seen by devices is of concern as it limits their performance and power efficiency and may even lead to failure in a functional device. In particular, large fast digital circuits in deep submicron process technologies are susceptible to supply voltage droop and therefore require extra development effort to ensure the power delivery network and the chip package are suitably tuned. Furthermore, with modern techniques of aggressive clock gating and with ever increasing power density this problem is becoming exasperated.

It may therefore be advantageous to detect supply voltage noise on-chip in order to detect unsatisfactory operating conditions. Detecting the supply grid off-chip may not provide a suitable measurement as there may be local droop due to changes in impedance or particular high power requirements of nearby devices. Detecting the supply voltage noise can be used either to help control the performance of the circuit by adjusting the voltage, the clocking frequency or functional operation of the circuit in response to detecting noise on the supply voltage, or it can be used when testing or debugging the circuit. In this regard supply voltage swing presents a tricky problem for test. BIST and scan test patterns are in no way guaranteed to replicate similar supply voltage droop events to functional test. In fact, since scan patterns are traditionally designed to exercise as much of the IC in as little time as possible, they often present a fairly constant, high current draw. This generally means that extra margin is required on supply voltage in order to prevent test escape.

It may however, be difficult to accurately detect supply voltage levels at different points within an integrated circuit. In particular, it may be difficult both to generate a suitable DC reference voltage as a comparison voltage and to implement a fast, low power and area comparator that is reasonably accurate. Generally such circuits are analogue in design and require large well matched transistors. This makes it difficult to add such monitoring circuit to areas of high cell density which are often the areas where fast voltage droop occurs. In particular, where the monitoring circuits are large, adding these circuits requires other cells to be moved further apart and may therefore increase wiring loading and effectively make the problem worse.

In summary on-chip supply noise is an increasingly important problem that can lead to over-margining to prevent test escapes. Monitoring noise on-chip is attractive to allow extra dynamic margin to be introduced adaptively, in adverse conditions. Detecting local supply noise at low power and area overhead is a significant challenge.

It would be advantageous to be able to monitor supply voltage levels within a circuit accurately in areas of high cell density and without increasing the power and area requirements of the circuit unduly.

SUMMARY

A first aspect provides an integrated circuit comprising a plurality of sensors configured to sense variations in supply voltage levels at points within said integrated circuit, said plurality of sensors being distributed across said integrated circuit;

said plurality of sensors comprising transistor devices such that local process variations in said transistor devices within said sensors are such that a sensing result will have a random voltage offset that has a predetermined probability of lying within a pre-defined voltage offset range; wherein said integrated circuit is configured to transmit results from multiple ones of said plurality of sensors to processing circuitry such that said variations in said supply voltage levels can be determined with a voltage offset range that is reduced compared to said pre-defined voltage offset range.

The present technique recognises that sensors comprising transistor devices may not be highly accurate, particularly where they are relatively small as the size of the devices may mean that they have a random voltage offset that has a predetermined probability of lying within a relatively large pre-defined voltage offset range. It also recognises that this can be counteracted by using many of them, such that the results can be combined and a reduced offset range achieved. Furthermore, using a large number of sensors, particularly where they are relatively small, enables them to be distributed throughout the integrated circuit and thus, they can detect voltage changes in different regions. Thus, although it may seem at first sight that sensors with potentially high voltage offsets are unsuitable for detecting changes in supply voltage due to their inaccuracies, when used in large quantities they are able to provide an accurate measurement. Furthermore, the ability to use sensors with potentially high voltage offsets enables small sensors that are generally less accurate to be used. This enables them not only to be distributed throughout the integrated circuit but also to be used in regions of high cell density where the changes in voltage level are most likely to occur.

In some embodiments, said integrated circuit is powered by a power supply that supplies a high supply voltage level and a low supply voltage level to said integrated circuit, said supply voltage level sensed being one of said high supply voltage level or said low supply voltage level.

The supply voltage may be supplied to the integrated circuit from a power supply that provides a high and low voltage level between which devices are powered. Changes in the supply voltage level may be measured with respect to either the high voltage level or the low voltage level.

Although traditionally it is the changes in the high voltage level that are measured it will be understood that changes in the low voltage level will also affect the voltage difference across the circuits such that variation in this supply voltage level may also be important.

In some embodiments, said low voltage level is ground voltage level. There may also be noise on the ground voltage supply and this too may also affect the circuitry and it may therefore be advantageous to measure changes in this voltage level.

In some embodiments, said sensor comprises a voltage level sensor for comparing said supply voltage level to a reference voltage level and for generating a digital result indicative of whether said supply voltage level is smaller or larger than said reference voltage level.

In some embodiments, the sensor for sensing the voltage level may be a voltage level sensor which compares the local supply voltage with a reference voltage, while in other embodiments it may be a different type of detector, perhaps one that detects a property of the circuit that the supply voltage affects. In other words an indirect measurement may be made. For example, the sensor may measure a delay for a signal to be transmitted through devices in the circuit. The supply voltage to the devices will affect how quickly digital circuits switch and thus, measuring the time it takes for a data value to travel through a portion of the circuit is an indication of the supply voltage.

The plurality of sensors generally have a same layout.

Although it may in some cases be appropriate to have several types of sensors, in some embodiments the sensors are formed of the same layout, in other words they are the same sensors with any variations between them due to process variations in their fabrication.

In some embodiments, said integrated circuit further comprises said processing circuitry, said processing circuitry being configured to receive results from multiple ones of said plurality of sensors and to determine said variations in said supply voltage level with said voltage offset range that is reduced compared to said voltage offset range of one of said sensors.

In some embodiments, the processing circuit receives the signals from multiple ones of the plurality of sensors perhaps all of them, or perhaps a subset of them and it determines from these results how many of them have detected an error and from this value it can calculate the variation in the supply voltage. As differences between sensors are due to process variations one can assume that variations in their voltage offset follow a Gaussian distribution and therefore if there are sufficient sensors one can determine the voltage difference between a reference voltage and the supply voltage to an increased accuracy compared to a single sensor by determining the number of sensors that indicate one of the voltages is higher.

In some embodiments, said integrated circuit further comprises a plurality of cells, said plurality of cells each comprising devices for performing a predetermined function, at least some of said sensors being located in areas of high cell density.

The integrated circuit may be formed of standard cells which each have devices for performing particular functions. These standard cells are arranged in a grid and have power supplied to them. In areas of high cell density there may be high power requirements and thus, voltage droop may occur at times of high activity. It may therefore be helpful to be able to measure the voltage level of the rail at these points. Conventional sensors were too large to be inserted into the design without significantly affecting the cell density which causes its own problems. Having sensors that are small and can themselves be in the form of a standard cell enables them to be inserted into the design at regions of high cell density where useful measurements can be made.

In some embodiments, said integrated circuit comprises at least ten voltage sensors and said voltage offset range is between 5 and 300 mV, depending on the fabrication technology employed.

The number of sensors used in an integrated circuit will depend on the accuracy of the individual sensors and the accuracy required but may be at least 10 and their voltage offset range will depend on their size but may be between 5 and 300 mV.

In some embodiments, said processing circuitry comprises calibration circuitry for calibrating each of said plurality of voltage level sensors to determine individual voltage offsets at which said voltage level sensors are balanced.

An alternative way of using the multiple sensors is to calibrate them individually, such that their individual offsets related to the mismatching of the devices can be detected and stored. If this is done then when one of the sensors indicates that the supply voltage is greater than the reference voltage for example, one can retrieve its offset from the storage and one can determine from that that the supply voltage is greater than the reference voltage plus or minus the offset value.

In some embodiments, said processing circuitry is configured to disable a subset of said plurality of voltage sensors in response to said calibration circuitry, said subset being selected from said plurality of sensors with a largest voltage offset.

The calibration circuitry may be used to determine which of the sensors is particularly unbalanced and has a particularly large offset. These sensors may not be useful as the supply voltage levels may never vary by that amount and thus, it may be advantageous to disable them in some ways and thereby reduce power consumption.

In some embodiments, said processing circuitry combines results from at least some of said sensors and performs a statistical analysis to determine global voltage level supply variations.

It may be advantageous to combine results from some, perhaps all of the sensors and determine global voltage level supply variations from a statistical analysis of the results rather than calibrating individual sensors and determining local voltage supply variations.

In some embodiments, said integrated circuit comprises a predetermined number of sensors with an offset voltage range, such that a statistically significant result from said sensors is attained, a larger offset voltage range requiring a larger number of sensors to attain said statistically significant result.

If the sensors used are very small and potentially have a large offset voltage range then if there are only a few of them the accuracy with which one can determine any variations in the supply voltage will be low. However, with a sufficient number of sensors one can determine the variation in supply voltage to a much greater accuracy as assuming the offset errors follow a Gaussian distribution, one can estimate where on the curve one is from the number of sensors that read one value and the number that read the other and therefore what the difference in voltage between the supply and reference voltage is. The smaller the devices and the larger their potential error the greater the number of devices one needs in order to achieve an acceptable accuracy. Thus, the number selected will depend on the accuracy of the individual sensors. It should be noted however that if one wants to detect large swings in voltages then it may be advantageous to have very small devices which have potential large offset voltage levels. If one has many of these one can determine to quite a high accuracy voltage swings varying from say 300 mV to 5 mV depending on the number that indicate one voltage is larger than the other.

In some embodiments, said processing circuitry is configured to combine results from sensors in different regions of said integrated circuit and to determine said variation in supply voltage levels in each of said different regions.

As the sensors are distributed throughout the integrated circuit, it may be advantageous to look at results from sensors in different regions and to determine where there are localised voltage swings. In this way advantage can be taken of both the distributed locations of the sensors to determine local variations and the averaging of a certain number to increase accuracy. Detecting local supply voltage variations may enable one to alter the characteristics of the circuit in that region, perhaps by increasing or decreasing supply voltage, increasing or decreasing clocking frequency or reducing switching activity in parts of the circuitry that require a lot of current.

In some embodiments, said integrated circuit further comprises a plurality of error detection circuits and error recovery circuitry;

said plurality of error detection circuits being configured to determine if a signal sampled in said processing apparatus changes within a time window occurring after said signal has been sampled and during a same clock cycle as said sampling and to signal an error if said signal does change;

said processing circuitry being configured to receive signals from said error detection circuits and to determine in response to detection of an error whether one of said plurality of sensors has indicated a change in supply voltage level.

Some integrated circuits are designed to operate in a region where errors may occur but are unlikely. This is possible provided they have error detection and recovery circuits. One example of such circuits are the razor circuits designed by ARM® of Cambridge UK. These circuits have the advantage of not needing to be tuned to operate in a safe region so they can be clocked faster or have lower supply voltages than conventional circuits on the understanding that errors may sometimes occur. Such a circuit can be used in conjunction with the sensors of this device so that detection of an error can be correlated with any of the plurality of sensors indicating detection of supply voltage variation.

As these sensors are small and therefore inaccurate their results are of limited value on their own, however if they are linked either with each other or with some calibration method or with an error detection system, then their results are of greater value. In this case, detecting a voltage level variation at the same time as an error provides two independent indications that there is a drop in voltage supply level and thus, one can be more confident of this result than simply the result from a single sensor and some remedial action can be taken.

In some embodiments, said processing circuitry is configured to determine whether said one of said plurality of sensors that indicated a change in supply voltage level is close to said error detection circuit and if so to indicate a change in supply voltage at said point.

It may be advantageous if the proximity of the error detection circuit and the sensor are tracked, and where they are close one can assume that the error was due to the swing detected in the voltage supply and where they are not close this may be less likely.

In some embodiments, said integrated circuit further comprises a plurality of error detection circuits and error recovery circuitry and calibration circuitry;

said plurality of error detection circuits being configured to determine if a signal sampled in said processing apparatus changes within a time window occurring after said signal has been sampled and during a same or adjacent clock cycle as said sampling and to signal an error if said signal does change;

said calibration circuitry being configured to vary conditions and determine when each of said error detection circuits detects an error and in response to detecting an error in one of said error detection circuits to vary said reference voltage level supplied to one of said plurality of sensors close to said error detection circuit such that said sensor signals a change in supply voltage level at a point close to a point where said error is generated.

In circuits with error detection capabilities, it may be advantageous to calibrate the sensors such that they switch to store a different value at a voltage variation level that generates an error signal. In this way, they can be used to determine where voltage variations have reached a level where errors are likely to occur and suitable measures can be taken.

In some embodiments, said processing circuitry is configured to vary at least one of a supply voltage, clocking frequency or processing function in response to detecting variations in supply voltage above a predetermined limit value.

Detection of changes in voltage level can be used in a number of ways. If the integrated circuit is operational it can be used to tune the circuit to improve performance. Thus, either the voltage level is reduced if it is detected to be too high or it is increased it if it is too low. Alternatively, the clocking frequency or processing functions may be varied such that where the voltage level is low, clocking frequency is decreased and the processing functions are reduced but where the supply voltage is high clocking frequency can be increased and processing functions allowed.

In some embodiments, said sensors comprise latching circuitry for latching said digital result, said latching circuitry being arranged in a chain such that result data stored in said latching circuitry can be serially output to said processing circuitry, said sensors being configured to output said result data in response to receipt of an output control signal.

The values from the sensors can be sent in parallel to the processing circuitry. Alternatively, they can be sent out via a scan chain serially. The latter clearly takes more time but requires less circuit area and fewer connections. In the case of the serially connected chain of latches then the data is not output continually but is rather output at a certain moment. This could be in response to an error detector detecting an error or it could be during calibration when the calibrating voltage has reached a predetermined level.

In some embodiments, said integrated circuit further comprises a plurality of flip flops, wherein each of said plurality of sensors has an area that is less than an area of two of said flip flops on said integrated circuit.

A typical size for a sensor is similar to that of a flip flop and in any case less than an area of two flip flops. This is small compared to a conventional sensor, and as such may have a relatively high pre-defined voltage offset range. However, the use of multiple sensors can address this drawback and having sensors of a similar size to other devices within the integrated circuit means that they can be produced in the form of a standard cell and aligned with the other standard cells within the integrated circuit allowing them to be inserted into suitable positions in a straightforward manner.

A second aspect of the present invention provides a method of sensing variations in supply voltage levels at points within an integrated circuit comprising the steps of:

arranging a plurality of sensors distributed across said integrated circuit;

said plurality of sensors comprising transistor devices such that local process variations in said transistor devices within said sensors are such that a sensing result will have a random voltage offset that has a predetermined probability of lying within a pre-defined voltage offset range;

transmitting results from multiple ones of said plurality of sensors to processing circuitry;

processing said results such that said variations in said supply voltage level can be determined with a voltage offset range that is reduced compared to said pre-defined voltage offset range.

A third aspect of the present invention provides an integrated circuit comprising a plurality of sensing means for sensing variations in voltage levels at points within said integrated circuit, said plurality of sensors means being distributed across said integrated circuit;

said plurality of sensing means comprising transistor devices such that local process variations in devices within said sensing means are such that a sensing result will have a random voltage offset within a pre-defined voltage offset range; wherein said integrated circuit is configured to transmit results from multiple ones of said plurality of sensing means to processing means for processing said results such that said variations in said voltage levels can be determined with a voltage offset range that is reduced compared to said pre-defined voltage offset range.

A fourth aspect of the present invention provides an integrated circuit comprising:

a plurality of sensors configured to sense variations in supply voltage levels at points within said integrated circuit, said plurality of sensors being distributed across said integrated circuit;

a plurality of error detection circuits and error recovery circuitry;

said plurality of error detection circuits being configured to determine if a signal sampled in said processing apparatus changes within a time window occurring after said signal has been sampled and during a same or an adjacent clock cycle as said sampling and to signal an error if said signal does change; wherein said plurality of sensors comprising transistor devices such that local process variations in said transistor devices within said sensors are such that a sensing result will have a random voltage offset that has a predetermined probability of lying within a pre-defined voltage offset range;

said integrated circuit being configured to transmit results from multiple ones of said plurality of sensors to processing circuitry and to transmit error signals from said error detection circuits to said processing circuitry, said processing circuitry being configured to determine a variation in said supply voltage level in response to detection of both one of said plurality of sensors indicating a drop in said supply voltage and said error detection circuitry detecting an error, and not determining a variation in said supply voltage level in response to detection of said plurality of sensors indicating a drop in said supply voltage and said error detection circuitry not detecting an error.

In circuits having error detecting and correcting capabilities, the detection of errors can be correlated with the sensor's results, and only when both are detected is a voltage variation indicated. In this way the potential lack of accuracy in the sensor is compensated for by correlating it with error detection.

The above, and other objects, features and advantages of this invention will be apparent from the following detailed description of illustrative embodiments which is to be read in connection with the accompanying drawings.

DESCRIPTION OF THE EXAMPLE NON-LIMITING EMBODIMENTS

Figure 1:
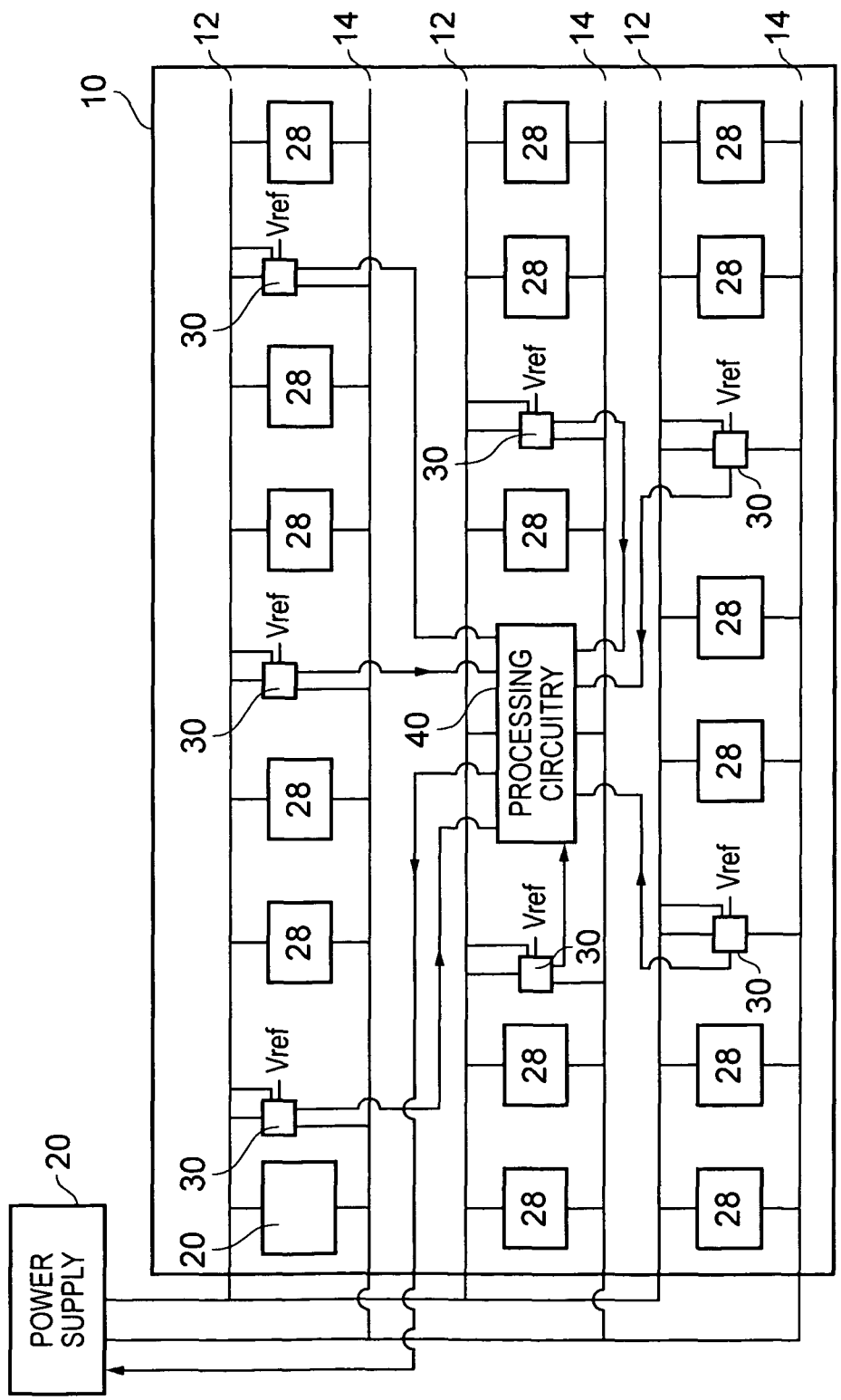
FIG. 1 shows an integrated circuit according to an embodiment of the present invention.

FIG. 1 shows an integrated circuit 10 according to an embodiment of the present invention. Integrated circuit 10 has voltage supply rails 12 and 14. Voltage supply rails 12 and 14 are connected to power supply circuitry 20. Voltage supply rail 12 has a high voltage level VDD and voltage supply rail 14 has a low voltage level VSS.

Integrated circuit 10 has cells 28 of devices that are arranged between the voltage rails 12, 14 and are powered by them. These cells 28 are in the form of standard cells sized to fit into a standard grid on the integrated circuit and comprise devices arranged to perform a particular function. They are powered by the power supply circuitry 20 via the voltage supply rails 12, 14 and the supply voltage levels on these rails may vary in dependence upon the load placed upon them. They may also vary with temperature. The devices within cells 28 have optimal operating conditions and variations in the supply voltage will affect these. Thus, it is desirable to maintain the supply voltage levels as constant as possible.

In order to detect changes in the voltage level on the supply rails 12, 14 there are voltage level sensors 30 distributed throughout integrated circuit 10. In this embodiment these voltage level sensors are powered by the voltage rails themselves and have an input from the higher voltage rail 12 which they compare with a reference voltage Vref. This reference voltage is taken from a reference voltage generator that is not shown. The reference voltage should be as constant as possible and as the supply voltage varies a difference between it and the reference voltage will be detected by the sensor 30 which will indicate variations to processing circuitry 40. Processing circuitry 40 will collect the results from all the sensors 30 and if a certain number show a variation in voltage level it will determine that the supply voltage has varied by a certain amount and it will transmit a signal to the power supply 20 to tell it to increase or decrease the power supply supplied to voltage rail 12.

These voltage sensors 30 are small devices which enable them to be placed alongside the cells 28 in the integrated circuit. As they are small and are formed of transistor devices they may not be well balanced and may have a reasonably high voltage offset associated with the comparison that they make with the reference voltage, and because of this any values detected by the sensors will have a potential error associated with them and can only determine that the voltage level has varied by an amount within an offset range that is a property of the sensors 30. However, as there are a number of sensors 30 within the integrated circuit 10 one can correlate the results from the different sensors 30 and from this one can deduce the voltage level variation from the number that detect a particular value to a reasonable degree of accuracy.

Figure 2:
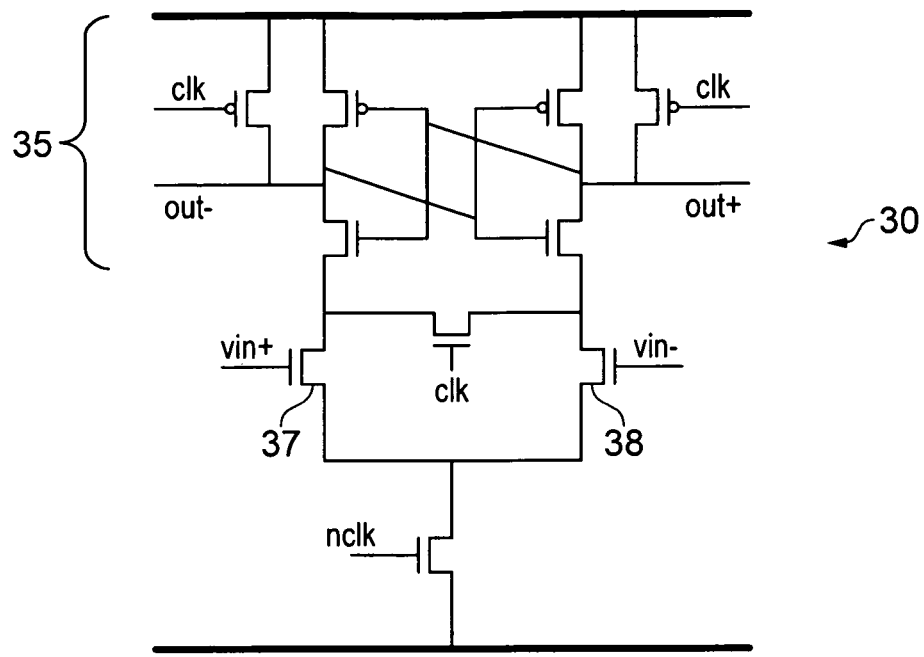
FIG. 2 shows a voltage sensor according to an embodiment of the present invention.

FIG. 2 shows an example of sensor 30 according to an embodiment of the present invention. In this embodiment sensor 30 consists of a dynamic latching comparator. Thus, the top portion of this sensor cell consists of cross coupled inverters which form a latch 35. The bottom portion has a differential pair of transistors 37 and 38 which act as the comparator. One of the transistors 37 receives the reference voltage at its input and one 38 receives the supply voltage at its input. These voltage levels will turn these devices on and both sides of the pre-charged latch will be pulled down. Depending on the voltage applied to the gate of transistor 37 or 38 one of them will have a lower resistance and will therefore pull down the voltage level of its side of the latch faster and the latch will switch to a zero on this side. As the device is quite small transistor 37 and 38 may not be particularly well matched as process variations may be quite high. Thus, one of them may have an inherent lower resistance, such that even if it has a smaller voltage at its gate than the other one it may still pull its side of the latch down faster. This means that there is an offset voltage in the result and that the point at which the two sides are equally pulled down will not be when the reference voltage and the supply voltage are exactly equal but when say the reference voltage is 0.2 V higher than the supply voltage. This lack of accuracy in the sensors means that the result detected by an individual device will not reveal the supply voltage variations to a great degree of accuracy, however this is compensated for by the use of many sensor and calibration or correlation.

For example, if many of these sensors are used together distributed throughout the integrated circuit as is shown in FIG. 1 and if processing circuitry is used to combine the results from the different sensors then, as it is fair to assume that the process variations in the different sensors will be random, one can determine the changes in supply voltage to a much higher degree of accuracy than would be achievable by a single sensor.

In this respect, processing circuitry 40 may combine the results to find a global voltage variation to a relatively high accuracy. In this regard, the random voltage offsets the comparators have will follow a Gaussian distribution due to random dopant fluctuations which dominate the variation of the device threshold voltage. The non-linear Gaussian cumulative distribution function can be mapped to a linear space using a piece-wise linear approximation or just by using the linear central part of the cumulative distribution function. In general $4^n$ comparators are required for n bits of resolution.

Alternatively or additionally, the distributed nature of the devices can be used to determine local variations as will be seen with respect to later figures.

The sensors in FIG. 2 are clocked and thus, for each clock cycle a comparison between the supply voltage and reference voltage is made and the value stored in the latch indicates which of the two it deems to be higher. A change in the number of sensors 30 within integrated circuit 10 that indicate one of the levels to be higher is an indication of a changing supply voltage level.

Figure 3:
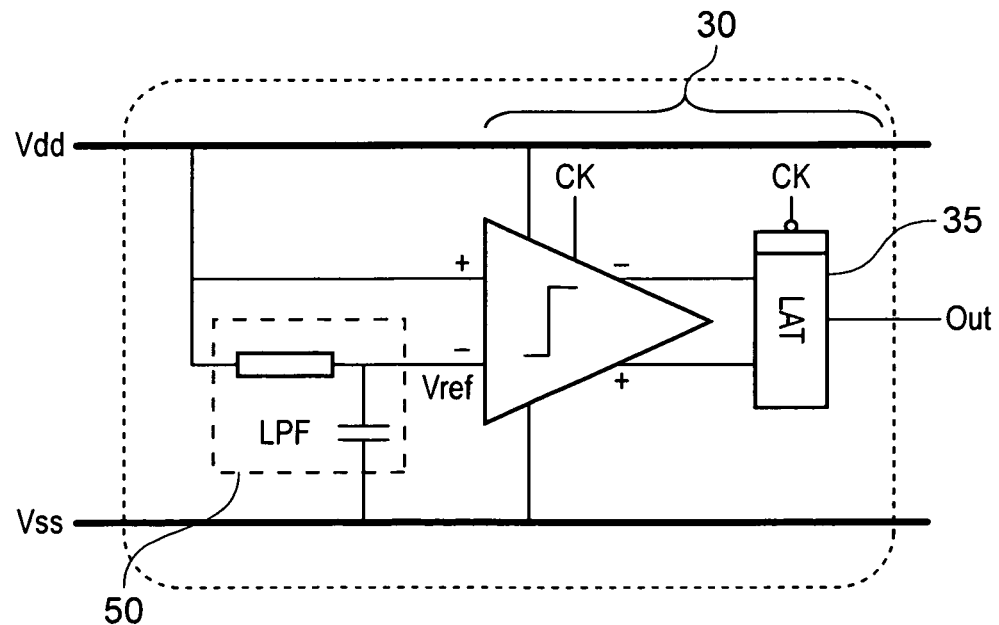
FIG. 3 shows a reference voltage generator and voltage sensor according to an embodiment of the present invention.

In the sensors 30 of FIGS. 1 and 2 a reference voltage is supplied to these devices. This may be generated in a number of ways. An example of a reference voltage generator 50 associated with voltage sensor 30 is shown in FIG. 3. Reference voltage generator 50 uses a local supply voltage Vdd and a simple RC low pass filter to generate a stable reference voltage. A disadvantage of this approach is the area overhead of the RC filter. There is also some poor DC accuracy as the reference voltage is subject to static IR as it is shared with the rest of the integrated circuit.

An alternative approach is to route a reference voltage to all sensor cells on the integrated circuit, the reference voltage being driven externally from a pin. It may alternatively be generated on chip using a charge pump for example.

The sensor of FIG. 3 has a negative edge latch following the dynamic comparator which ensures that the output signal is stable over both phases of the clock cycle. This additional latch may not be required if the following state element is a negative edge latch or flip-flop. There are usage scenarios that require a "sticky" latch, that is, a latch that has a state (which could be "1" or "0" or configurable) that can only be transitioned out of using a reset signal, for example where the results of the multiple sensors are collected serially via a scan chain in response to a signal. The sticky latch can be incorporated either into the dynamic comparator, by means of conditional pre-charge, or the negative latch can be modified to implement a sticky latch.

Figure 4A:
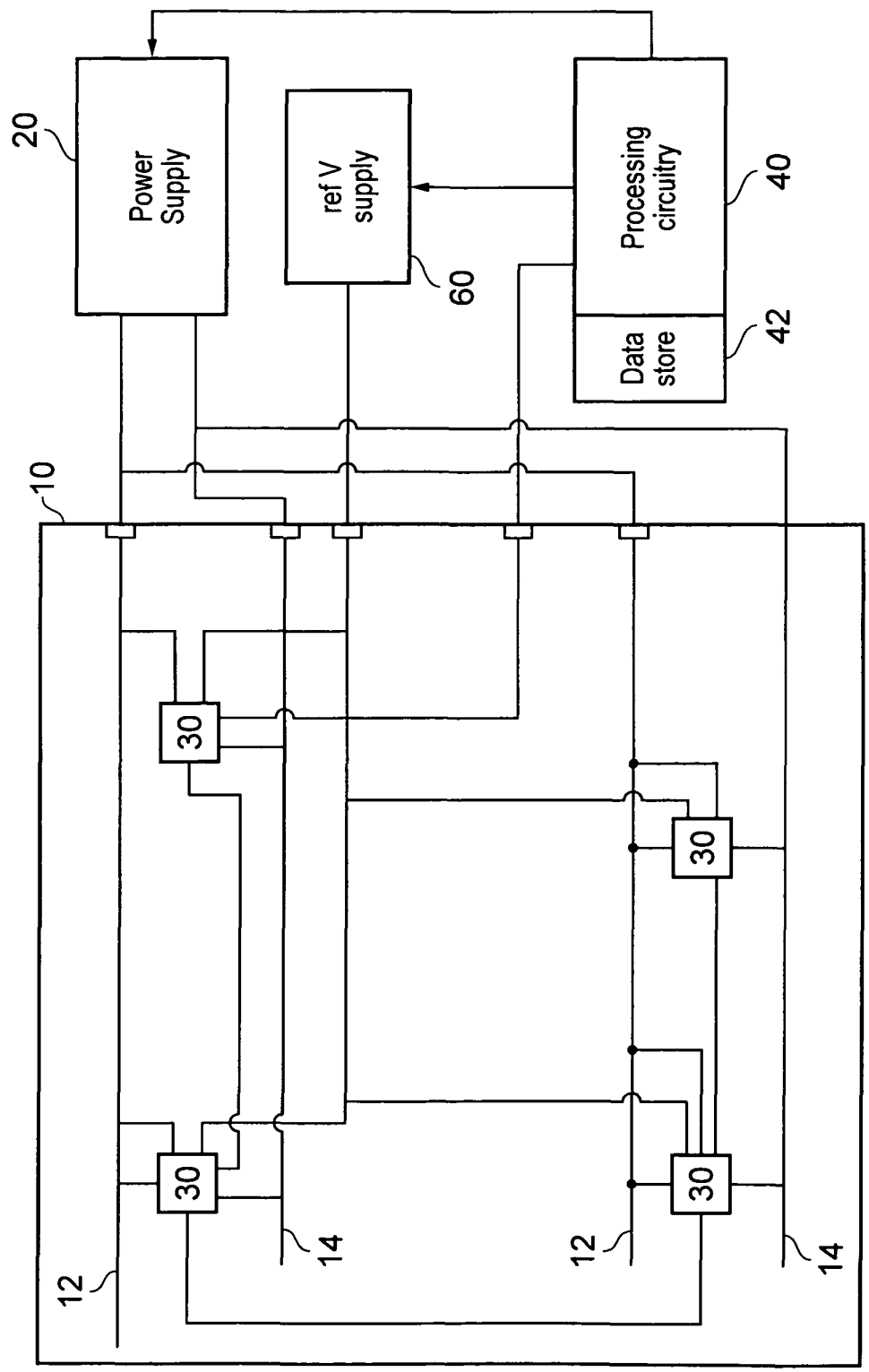
FIG. 4a shows an integrated circuit with voltage sensors that are serially read out and calibrated according to an embodiment of the present invention.

FIG. 4a shows an alternative embodiment of an integrated circuit 10 where the processing circuitry 40 is in this case off-chip along with power supply 20. In this embodiment there is a reference voltage supply 60 that is also external to the integrated circuit 10. As in the embodiment in FIG. 1 there are high and low power rails 12 and 14 and there are sensors cells 30 which sense variations in the voltage level of the high voltage rail.

In this embodiment, the sensor cells 30 are calibrated and their offset voltages, these being the voltage difference at which the latches will switch the values that they store, are determined during calibration and are stored in data store 42. When during normal operation these sensor cells 30 output a result, the data store is accessed to determine what their offset voltage is and the difference in voltage level that this result indicates can be determined from the offset voltage level and the reference voltage level.

Initially when the integrated circuit is inactive the sensors 30 are calibrated by sweeping the reference voltage 60 and periodically sampling the sensors 30 to determine at which point they switch from storing a 0 to storing a 1. In this embodiment, the sensors 30 are arranged in a chain and thus, the values that they latch to are output serially via this chain in response to an output signal from processing circuitry 40. Thus, during calibration the reference voltage supply is increased incrementally and each time it is increased the sensors are sampled and the value stored is output. The point at which each sensor switches to storing a 1 is recorded in data store 42 and later during normal operation they are monitored and when they are read the value that they switched at during calibration is determined from data store 42 and it is determined from that what their result indicates with respect to supply voltage level.

In some embodiments sensors that have large offset voltages may be disabled as they will rarely or never switch value and thus, they simply consume power without providing any benefit.

Figure 4B:
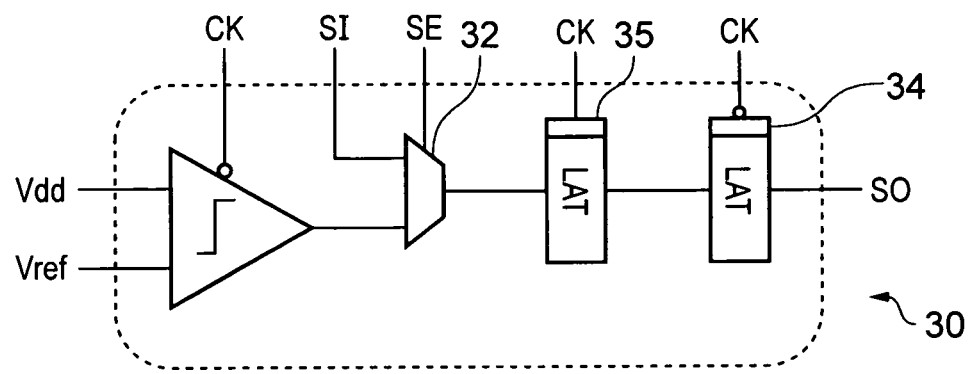
FIGS. 4b and 4c shows examples of sensors that can be used in a scan chain.
Figure 4C:
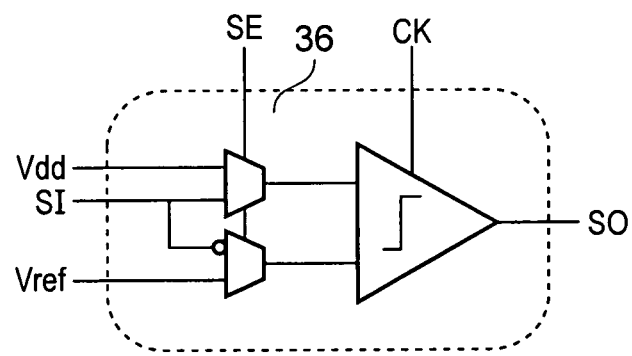

In order to scan out the sensor bits serially, it is necessary to add some additional circuitry to the sensor cell 30. FIG. 4b shows how a scan mux 32 and additional latch 34 can be added to allow scan operation. One of the latches 34, 35 can be removed if it is acceptable to clock alternate sensor cells 30 on the opposite clock phase. The scan enable (SE) bits are connected together and the scan-in (SI) bits are connected to the nearest scan-out (SO) pins in the usual fashion. The scan approach is attractive as it leads to a very low overhead of additional circuitry, but is only suitable for low-bandwidth or tide-mark measurements. FIG. 4c shows how scan based readout can be achieved with only an additional transmission gate mux 36 on the front of the circuit, by taking advantage of the fact that the dynamic comparator is capable of operating as a digital latch when scanning out the data. Again the arrangement in FIG. 4c requires that alternate sensor cells in the chain are on opposite clock phases.

Figure 5:
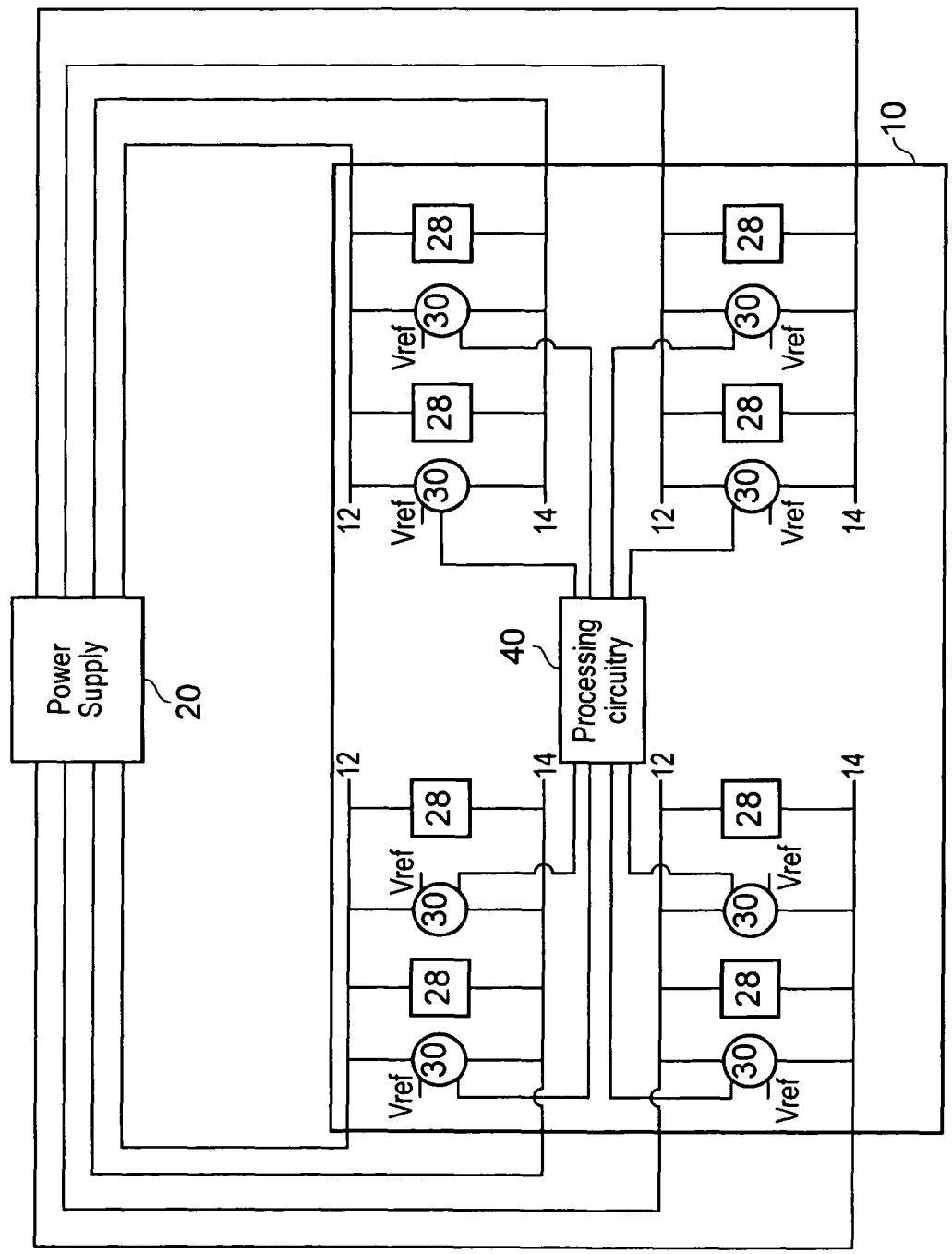
FIG. 5 shows an integrated circuit having voltage sensors for measuring supply voltage changes in different regions of the integrated circuit according to an embodiment of the present invention.

FIG. 5 shows an alternative embodiment of integrated circuit 10. In this embodiment sensors are shown schematically as devices 30 and they are in this embodiment monitoring changes in the low voltage level of the ground rail 14.

In this embodiment the power supply supplies different regions of the integrated circuit independently. Processing circuitry 40 monitors sensors in the different regions and determines whether the changes in the voltage supply of the ground voltage rail are sufficient to change the values stored in the sensors. There are a certain number of sensors in each portion of the circuit and if more than a certain number change the value that they store it is determined that the change in the voltage level is above a predetermined value. This may be sufficient to require the processing circuitry to change the conditions of the integrated circuit and thus, if it detects that in one of the regions the voltage level has changed by more than a certain amount it will send a control signal perhaps to the power supply such that the power supply is adjusted by a corresponding amount to compensate for the detected change thereby maintaining operation of the integrated circuit 10 close to its optimal point. In this embodiment the results from the different sensors are sent in parallel to the processing circuitry. For parallel readout, it is necessary to route the output of each sensor cell to the point of use. It may be possible to reduce the wiring requirements if only the population count of the sensor cell outputs is required, in this case a redundant adder (compressor tree) or non-redundant adder can be incorporated into the routing to reduce the number of buffered long wires.

Figure 6:
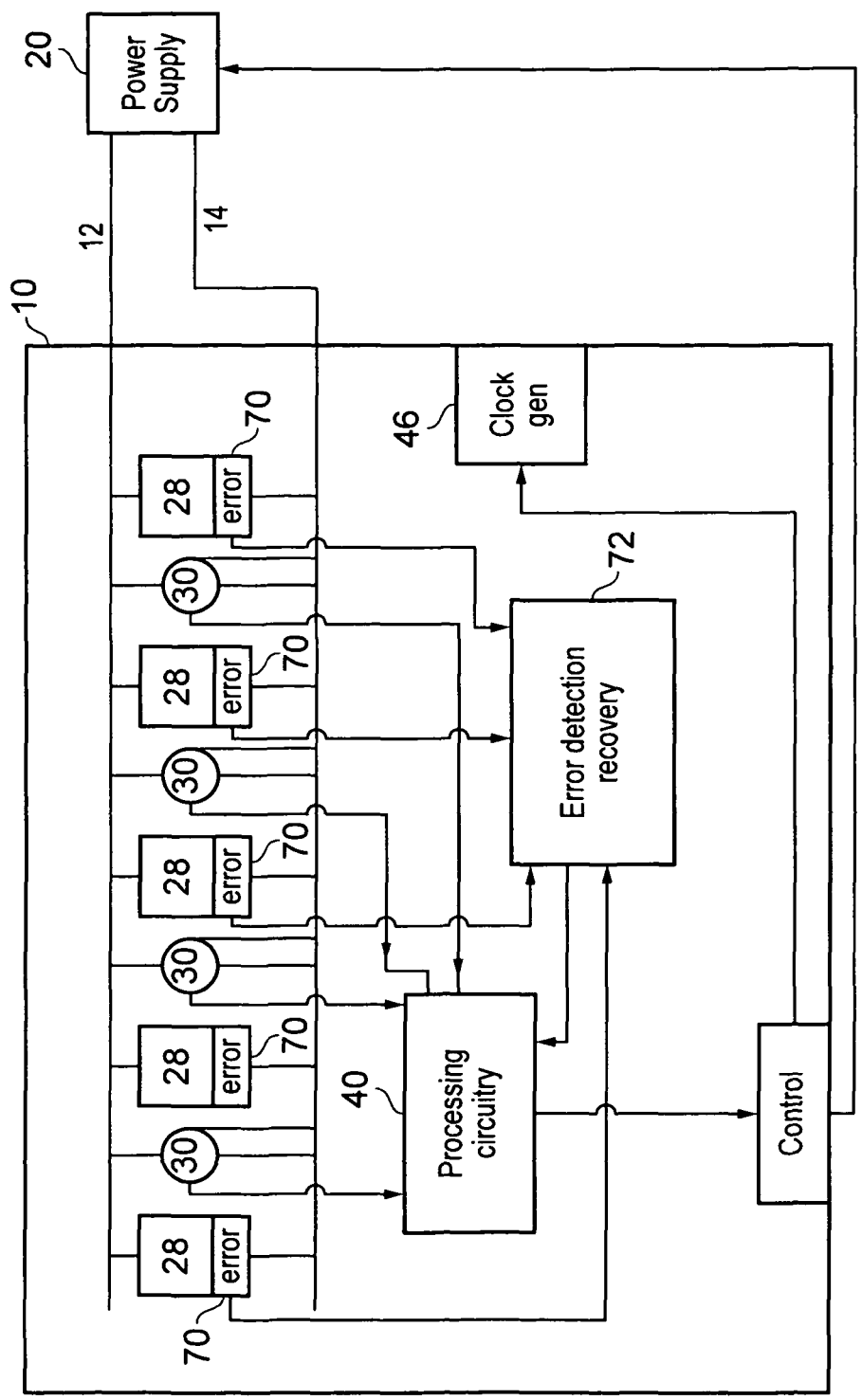
FIG. 6 shows an integrated circuit with error detecting and recovery means and with voltage sensors according to an embodiment of the present invention.

FIG. 6 shows a further integrated circuit 10 according to an embodiment of the present invention. This integrated circuit 10 has cells of devices 28 which have error detection circuitry 70 associated with them. There is a central error detection and recovering circuitry 72 that receives signals from different error circuits 70 and performs the appropriate error recovery in response to them. It also sends a signal to processing circuitry 40 indicating when it detects an error from a circuit and where the circuit was. Processing circuitry 40 then looks to the sensors that are in the region of the detected error and determines whether they have detected a change in supply voltage level. If they have then it seems likely that the error was caused by the swing in voltage level and a signal is sent to control circuitry 44 which indicates to the power supply 20 or the clock generator 46 that their output values should be altered. In this way, although the sensors 30 may not be highly accurate they are correlated with the error detection mechanism and if both an error and a change in voltage are detected the probability that there is a variation in voltage level is higher than if only the results of the sensor were taken and thus, it may be appropriate to take action.

In some embodiments, the system may be calibrated such that the sensors are provided with an offset to the reference voltage that they receive in order to make their balance point be at a supply voltage level that is close to a value at which an error may be detected. In this case, calibration can be performed by lowering the supply voltage until an error is detected and then the reference voltage supplied to the surrounding sensors can be varied until they themselves indicate the supply voltage is lower than the reference voltage. In this way, each sensor will be calibrated to detect voltage level changes at a point close to a point where an error will be generated. This will make each sensor sense the appropriate changes and help keep the circuit operating close to its optimal point where errors are rare.

It should be noted that there are numerous ways to calibrate the distributed voltage sensors with the aim of either reducing their power consumption or increasing their resolution. The aim of calibration may be either to tune parameters of the cells to improve resolution or to disable cells that are not providing useful feedback in order to reduce power consumption.

It should also be noted that although in this embodiment readings from the sensors are collected in parallel to each other, they may be arranged serially as in FIG. 4 and in response to an error detection a scan enable control signal will be sent to determine if the sensors are indicating a reduced voltage level.

Figure 7:
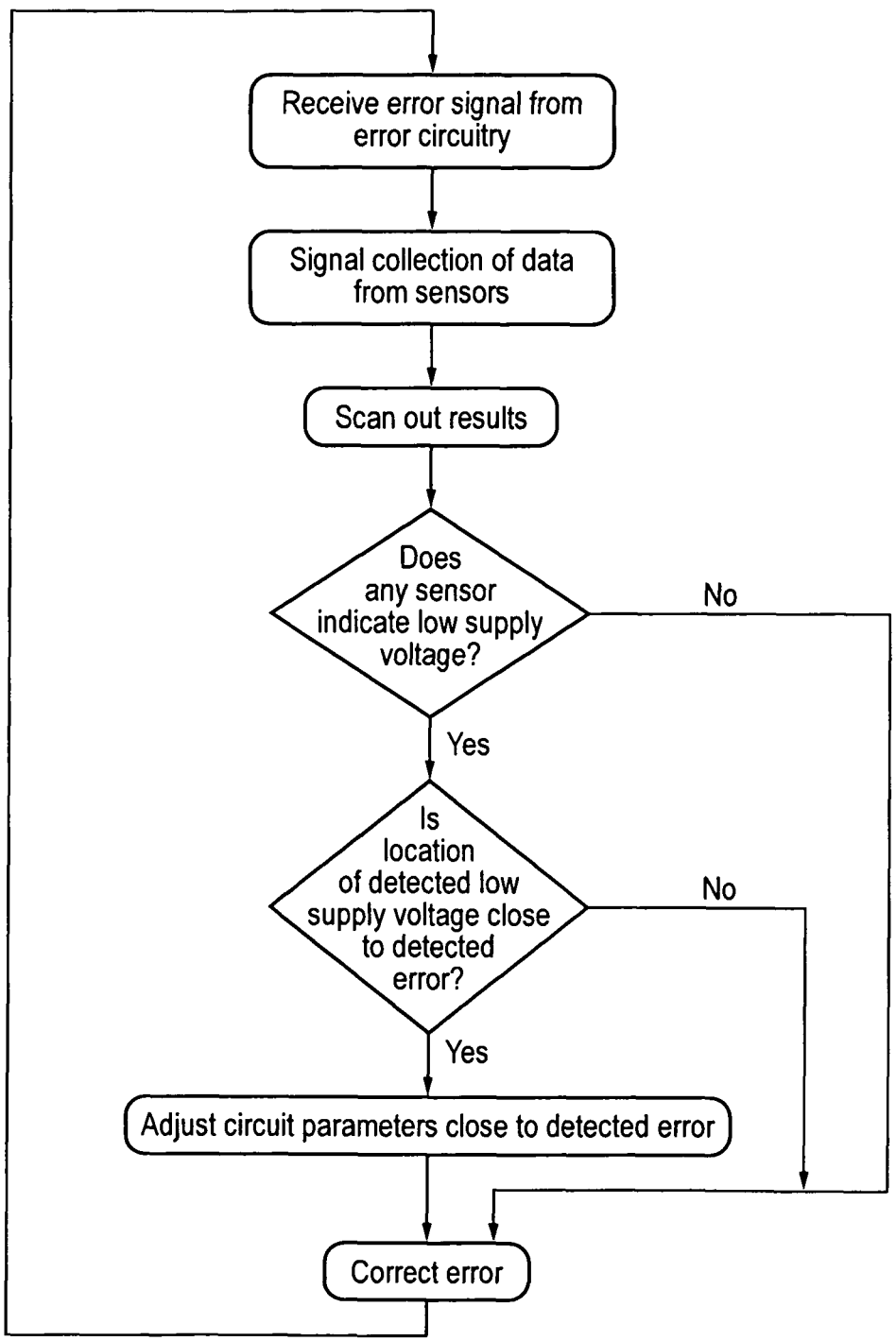
FIG. 7 shows a flow diagram illustrating steps in a method for sensing voltage in a circuit having error detection capabilities.

FIG. 7 shows a flow diagram illustrating a method of measuring supply voltage levels in an integrated circuit that has an error detecting capability.

When an error signal is received from error circuitry the processing circuitry signals that data should be collected from the voltage sensors. The results from these sensors are scanned out and it is determined whether any sensor indicates a low voltage supply. If they don't then the error is simply corrected. If they do it is then determined if the location of the low supply voltage that is detected is close to the detected error. If it is then the circuit parameters close to the detected error are varied perhaps by lowering the clocking frequency or increasing the voltage supply. The error is then corrected.

Figure 8:
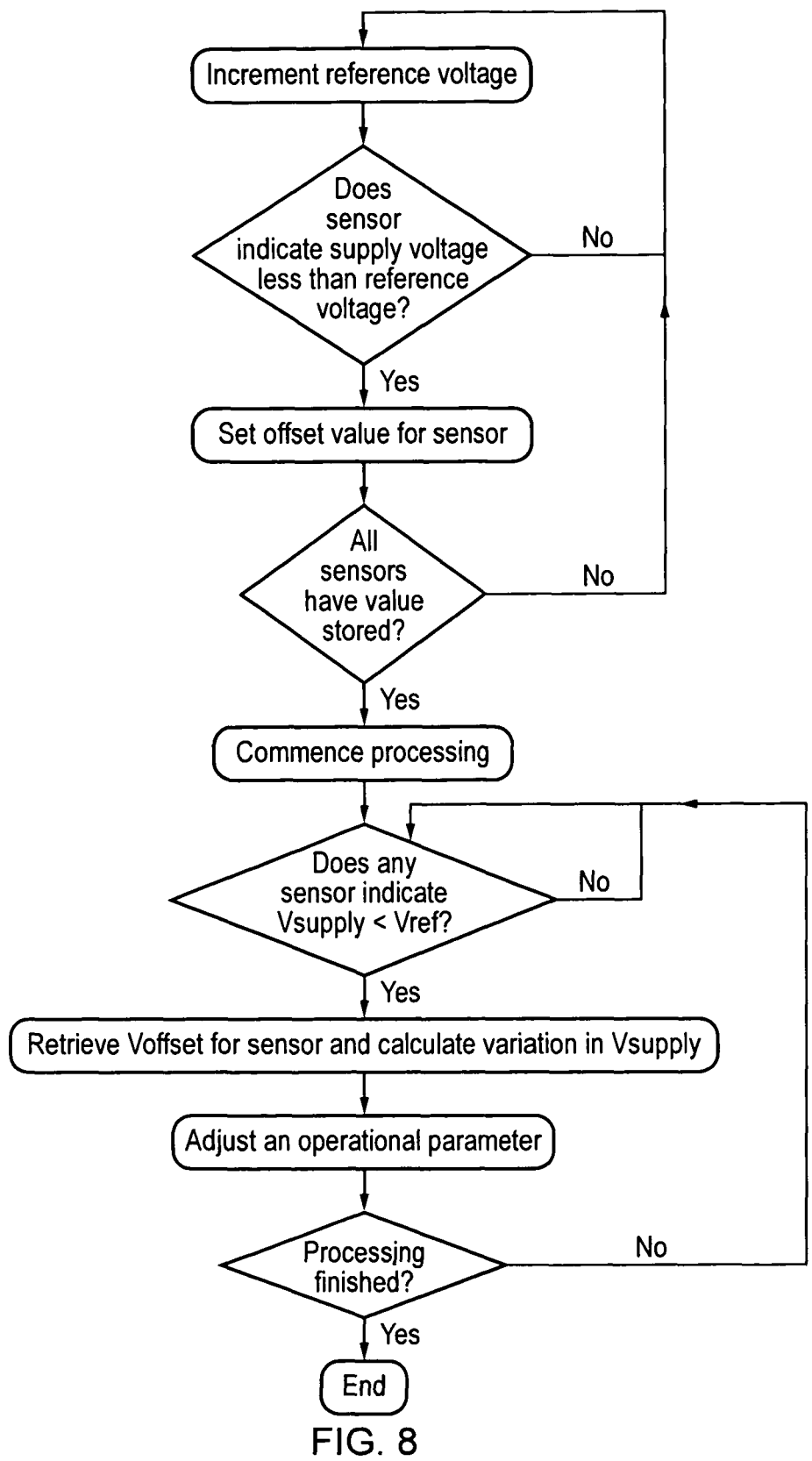
FIG. 8 shows steps in a method for calibrating voltage sensors in an integrated circuit.

FIG. 8 shows a method of calibrating the sensors in an integrated circuit according to an embodiment of the present invention. Initially prior to the circuit commencing processing the reference voltage is swept such that it is incrementally increased. At each incremental increase the sensors are analysed to determine if any indicate that the supply voltage is less than the reference voltage. If any do then the current reference voltage is noted and an offset for that sensor (supply voltage minus current reference voltage) is stored for that sensor. When all sensors have had their offset values stored the circuit commences processing and the sensors are monitored to see when they change value to indicate VSupply<Vref. When they indicate this the stored data is accessed and the variation in the supply that this detected value implies is determined from the reference voltage and the stored offset. Parameters of the circuit can then be adjusted accordingly. If it is noted that the sensor has a large offset, it triggering may either never happen or may happen when the supply voltage is actually significantly higher than the reference voltage, in either case the sensor may not be useful and it may be decided following calibration to disable sensors with large offsets.

Figure 9:
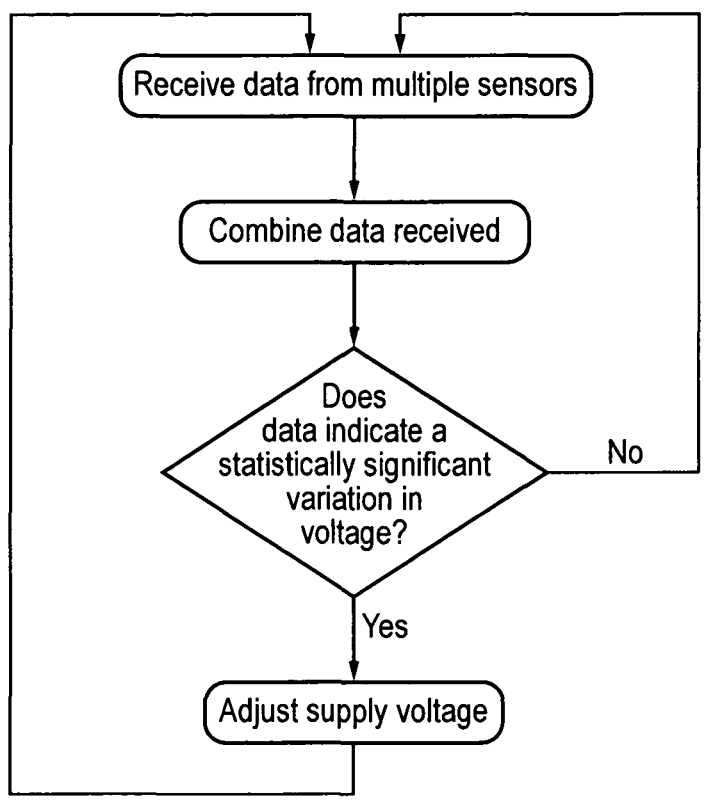
FIG. 9 shows steps in a method for detecting voltage using multiple small voltage sensors.

FIG. 9 shows a method for monitoring the voltage levels in a circuit. Initially data is received for multiple sensors. This may be done in parallel for all sensors on each clocking cycle or it may be done in series periodically. The data is then combined and it is determined whether a significant number of the sensors indicate either that the reference voltage is less than the supply voltage or that it is more. If they do then it is determined that the supply voltage has changed by a certain amount at which point action should be taken and it is adjusted accordingly. If not then they are monitored again perhaps on the next clock cycle or a predetermined time later and the analysis is performed again. In this way the operating point of the circuit can be kept close to an optimum point.

It should be noted that although in many of the examples given these sensors have been used in tuning circuits to enable the integrated circuit to operate close to their optimum operating point, they can also be used to determine voltage levels in testing chips when characterising them or when debugging them. In all instances the use of distributed sensors that are small and can be placed to close to high density regions of cells enables voltage levels to be measured at different points within the cell with high accuracy.

They can also be used as canary circuits to detect where there may be problems.

To give an idea of realistic performance in a modern process technology, a suitable cell based on the schematic of FIG. 2 has been designed with very conservative sizing in 32 nm. The resulting area was 3.8 µm×1.3 µm, which is comparable to a flip-flop cell in the same technology. Power dissipation for the design depends proportionally on the clock frequency, but at 3 GHz, which is a very high-performance point, the power dissipation of a single cell is 25 µW. To put this in context, in order to implement an un-calibrated supply noise monitor with 3 effective bits of resolution (8 levels) requires 64 sensor cells distributed across the die, which would cost an area of 243.2 µm×1.3 µm and at 3 GHz requires 1.6 mW. For a spread of 200 mV, this gives a resolution of 25 mV. Some additional logic is required to process the outputs from the sensor cells, but as many modern multi-core SoCs now have a dedicated microcontroller this would be more than sufficient for such a purpose.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the appended claims. For example, various combinations of the features of the following dependent claims could be made with the features of the independent claims.

We claim:

1. An integrated circuit comprising a plurality of sensors configured to sense variations in supply voltage levels at points within said integrated circuit, said plurality of sensors being distributed across said integrated circuit;
    said plurality of sensors comprising transistor devices such that local process variations in said transistor devices within said sensors are such that a sensing result will have a random voltage offset that has a predetermined probability of lying within a pre-defined voltage offset range; wherein
    said integrated circuit is configured to transmit results from multiple ones of said plurality of sensors to processing circuitry.

2. An integrated circuit according to claim 1, wherein said integrated circuit is powered by a power supply that supplies a high supply voltage level and a low supply voltage level to said integrated circuit, a supply voltage level sensed being one of said high supply voltage level or said low supply voltage level.

3. An integrated circuit according to claim 2, wherein said low supply voltage level is a ground voltage level.

4. An integrated circuit according to claim 1, wherein each of said plurality of sensors comprises a voltage level sensor configured to compare a supply voltage level to a reference voltage level and to generate digital result indicative of whether said supply voltage level is smaller or larger than said reference voltage level.

5. An integrated circuit according to claim 4, wherein said processing circuitry comprises calibration circuitry for calibrating each of said plurality of sensors to determine individual voltage offsets at which said voltage level sensors switch said generated digital result.

6. An integrated circuit according to claim 5, said processing circuitry being configured to disable a subset of said plurality of voltage sensors in response to said calibration circuitry, said subset being selected from said plurality of sensors with a largest voltage offset.

7. An integrated circuit according to claim 4, said integrated circuit further comprising a plurality of error detection circuits and error recovery circuitry and calibration circuitry;
    said plurality of error detection circuits being configured to determine if a signal sampled in said integrated circuit changes within a time window occurring after a sampling of said signal and during a same clock cycle as said sampling of said signal and to signal an error if said signal does change;
    said calibration circuitry being configured to vary conditions and determine when each of said error detection circuits detects an error and in response to detecting an error in one of said error detection circuits to vary said reference voltage level supplied to one of said plurality of sensors close to said error detection circuit such that said one of said plurality of sensors signals a change in supply voltage level at a point close to a point where said error is generated.

8. An integrated circuit according to claim 4, said sensors comprising latching circuitry for latching said digital result, said latching circuitry being arranged in a chain such that said digital result stored in said latching circuitry is serially output to said processing circuitry, said sensors being configured to output said result data in response to receipt of an output control signal.

9. An integrated circuit according to claim 1, said integrated circuit further comprising said processing circuitry, said processing circuitry configured to receive results from multiple ones of said plurality of sensors and to determine said variations in said supply voltage level with said voltage offset range that is reduced compared to said pre-defined voltage offset range.

10. An integrated circuit according to claim 1, wherein each of said plurality of sensors have a same layout.

11. An integrated circuit according to claim 1, said integrated circuit further comprising a plurality of cells, said plurality of cells each comprising devices for performing a predetermined function, at least some of said sensors being located in areas of high cell density.

12. An integrated circuit according to claim 1, wherein said integrated circuit comprises at least ten voltage sensors and said pre-defined voltage offset range is between 5 and 300 mV.

13. An integrated circuit according to claim 1, wherein said processing circuitry combines results from at least some of said sensors and performs a statistical analysis to determine global voltage level supply variations.

14. An integrated circuit according to claim 13, wherein said integrated circuit comprises a predetermined number of sensors with a pre-defined offset voltage range, such that a statistical significant result from said sensors is attained, a larger pre-defined offset voltage range requiring a larger number of sensors to attain said statistical significant result.

15. An integrated circuit according to claim 1, wherein said processing circuitry is configured to combine results from sensors in different regions of said integrated circuit and to determine a variation in supply voltage levels in each of said different regions.

16. An integrated circuit according to claim 1, said integrated circuit further comprising a plurality of error detection circuits and error recovery circuitry;

said plurality of error detection circuits being configured to determine if a signal sampled in said integrated circuit changes within a time window occurring after a sampling of said signal and during a same or an adjacent clock cycle as said sampling of said signal and to signal an error if said signal dose change;

said processing circuitry being configured to receive signals from said error detection circuits and to determine in response to detection of an error whether one of said plurality of sensors has indicated a change in supply voltage level.

17. An integrated circuit according to claim 16, wherein said processing circuitry is configured to determine whether a one of said plurality of sensors that indicated a change in supply voltage level is close to an error detection circuit and if so to indicate a change in supply voltage at said point.

18. An integrated circuit according to claim 1, said processing circuitry being configured to vary at least one of a supply voltage, clocking frequency or processing function in response to detecting variations in supply voltage that rise above a predetermined limit value.

19. An integrated circuit according to claim 1, said integrated circuit further comprising a plurality of flip flops, wherein each of said plurality of sensors has an area that is less than an area of two of said flip flops on said integrated circuit.

20. A method of sensing variations in supply voltage levels at points within an integrated circuit comprising the steps of:

arranging a plurality of sensors distributed across said integrated circuit;

said plurality of sensors comprising transistor devices such that local process variations in said transistor devices within said sensors are such that a sensing result will have a random voltage offset that has a predetermined probability of lying within a pre-defined voltage offset range;

transmitting results from multiple ones of said plurality of sensors to processing circuitry;

processing said results such that said variations in said supply voltage levels are determined with a voltage offset range that is reduced compared to said pre-defined voltage offset range.

21. A method according to claim 20, wherein said processing step combines results from at least some of said sensors and performs a statistical analysis to determine global voltage level supply variations.

22. A method according to claim 20, wherein said method comprises further initial steps of:

determining a desired offset voltage error range for said sensors;

selecting a size of sensor to provide desired offset voltage error range;

determining a number of said sensors with said desired offset voltage error range such that a statistical significant result from said sensors is attained, a larger offset voltage error range requiring a larger number of sensors to attain said statistical significant result;

arranging said number of said sensors as said plurality of sensors throughout said integrated circuit.

23. An integrated circuit comprising a plurality of sensing means for sensing variations in voltage levels at points within said integrated circuit, said plurality of sensing means being distributed across said integrated circuit;

said plurality of sensing means comprising transistor devices such that process variations in said transistor devices within said sensing means are such that a sensing result will have a random voltage offset that has a predetermined probability of lying within a pre-defined voltage offset range; wherein said integrated circuit is configured to transmit results from multiple ones of said plurality of sensing means to processing means for processing said results.

\* \* \* \* \*